United States Patent
Mizutani

(10) Patent No.: US 10,199,812 B2
(45) Date of Patent: Feb. 5, 2019

(54) SHIELDED CONDUCTIVE PATH FOR SHIELDING A PLURALITY OF ELECTRICAL WIRES

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yoshio Mizutani, Mie (JP)

(73) Assignees: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/531,048

(22) PCT Filed: Nov. 13, 2015

(86) PCT No.: PCT/JP2015/081963
§ 371 (c)(1),
(2) Date: May 26, 2017

(87) PCT Pub. No.: WO2016/088533
PCT Pub. Date: Jun. 9, 2016

(65) Prior Publication Data
US 2017/0324231 A1    Nov. 9, 2017

(30) Foreign Application Priority Data
Dec. 3, 2014 (JP) ................. 2014-245074

(51) Int. Cl.
*H02G 3/06* (2006.01)
*H02G 3/04* (2006.01)
(Continued)

(52) U.S. Cl.
CPC ....... *H02G 3/0481* (2013.01); *B60R 16/0215* (2013.01); *H01B 7/0045* (2013.01);
(Continued)

(58) Field of Classification Search
CPC ........ H02G 3/0481; H02G 3/04; H01B 9/006; H01B 9/02; H01B 7/17; H01B 7/20; H05K 9/00
See application file for complete search history.

(56) References Cited

U.S. PATENT DOCUMENTS 5,091,604 A  *  2/1992  Kirma .................. H02G 3/0666
                                                           174/2
6,914,190 B2 *  7/2005  Dunand ............... H02G 3/0468
                                                           174/71 R
(Continued)

FOREIGN PATENT DOCUMENTS

JP    2004171952 A    6/2004
JP    2006310474 A    11/2006
(Continued)

OTHER PUBLICATIONS

International Search Report for Application No. PCT/JP2015/081963 dated Jan. 26, 2016, 4 pages.
(Continued)

Primary Examiner — Michael F McAllister
(74) Attorney, Agent, or Firm — Reising Ethington, P.C.

(57) ABSTRACT

A shielded conductive path (Wa) includes: a shielding pipe that encloses first and second electrical wires together; a first insertion path that is formed inside the shielding pipe and into which the first electrical wire is inserted; a second (Continued)

insertion path that is formed inside the shielding pipe, is separated from the first insertion path by a partition wall, and into which the second electrical wire is inserted; and a shielding tube that includes at least a portion of a flexible shielding member that is tubular. The shielding tube is connected to an end portion of the first insertion path so as to prevent the first and second electrical wires from being affected by electromagnetic noise therefrom.

3 Claims, 4 Drawing Sheets

(51) Int. Cl.
*B60R 16/02* (2006.01)
*H01B 7/00* (2006.01)
*H05K 9/00* (2006.01)

(52) U.S. Cl.
CPC ............ *H02G 3/0406* (2013.01); *H02G 3/06* (2013.01); *H05K 9/0007* (2013.01); *H05K 9/0098* (2013.01)

(56) References Cited

U.S. PATENT DOCUMENTS

| | | | | |
|---|---|---|---|---|
| 7,497,284 | B2* | 3/2009 | Yamaguchi | B60R 16/0215 174/135 |
| 7,687,714 | B2* | 3/2010 | Deterre | H01R 4/72 174/72 A |
| 2004/0099427 | A1 | 5/2004 | Kihira | |
| 2004/0256136 | A1* | 12/2004 | Dunand | H02G 3/0468 174/71 R |
| 2011/0155458 | A1* | 6/2011 | Kato | B60R 16/0215 174/74 R |
| 2012/0279776 | A1* | 11/2012 | Mizutani | H02G 3/0481 174/350 |
| 2014/0076628 | A1* | 3/2014 | McGrath | H01B 7/0045 174/84 R |
| 2015/0287500 | A1 | 10/2015 | Mizutani | |
| 2015/0366106 | A1 | 12/2015 | Yanagihara | |

FOREIGN PATENT DOCUMENTS

| | | |
|---|---|---|
| JP | 2011146228 A | 7/2011 |
| WO | WO2014119404 A1 | 8/2014 |

OTHER PUBLICATIONS

International Search Authority for Application No. PCT/JP2015/081963, 3 pages.

* cited by examiner

SHIELDED CONDUCTIVE PATH FOR SHIELDING A PLURALITY OF ELECTRICAL WIRES

CROSS REFERENCE TO RELATED APPLICATIONS

This application claims the priority of Japanese patent application JP2014-245074 filed on Dec. 3, 2014, the entire contents of which are incorporated herein.

TECHNICAL FIELD

The present invention relates to a shielded conductive path that has a configuration in which a plurality of electrical wires are enclosed by a shielding portion that is tubular.

BACKGROUND ART

Patent Document 1 (JP2004-171952A) discloses technology for routing electrical wires under the floor of a vehicle such as a hybrid car, to connect, for example, devices that are provided in a rear part of the vehicle, such as a high-voltage battery, and devices that are provided in a front part of the vehicle, such as an inverter and a fuse box, to each other. The plurality of electrical wires are inserted into a metal pipe that is provided with a shielding function as well as the function of protection from interference by foreign objects. Also, a flexible shielding member that is tubular and is constituted by braided wires or the like is connected to an end portion of the pipe, and portions of the electrical wires, the portions being led out of the pipe, are enclosed by the flexible shielding member. Since it is easy to bend the flexible shielding member, the flexible shielding member is useful when electrical wires are to be bent to be routed and connected to devices.

Also, Patent Document 2 (JP2011-146228A) discloses technology for shielding electromagnetic noise, and when the plurality of electrical wires are electrical wires of different types such as a powering electrical wire through which large amount of high-voltage currents flow and an electrical wire for a low-current system, and there is the risk of the plurality of electrical wires being mutually or unilaterally affected by electromagnetic noise therefrom, the inside of the pipe is divided into a plurality of insertion spaces by partition walls, and the plurality of electrical wires are individually inserted into the plurality of insertion spaces in order to prevent the electrical wires from being affected by electromagnetic noise.

SUMMARY

When electrical wires of a plurality of types are routed between a rear part and a front part of a vehicle, a configuration that may be useful is that in which the electrical wires of the plurality of types are separately inserted into a metal pipe in which the inside thereof is divided into a plurality of insertion spaces by partition walls, and a flexible shielding member is connected to an end portion of the pipe. When an electrical wire of a certain type out of the electrical wires of the plurality of types is branched off and extends toward its connection point, it is possible to conceive of, for example, drawing the electrical wire to the outside of the flexible shielding member from a midpoint thereof.

However, if such a configuration is employed, the electrical wires of the plurality of types, which are isolated from each other inside the pipe so as not to be mutually affected by electromagnetic noise therefrom, are not isolated inside the flexible shielding member. Therefore, inside the flexible shielding member, there is the risk of the electrical wires of the plurality of types being affected by electromagnetic noise therefrom.

The present design has been completed in light of the above-described situation, and aims to secure a shielding function.

A shielded conductive path according to the design may include:

a shielding pipe that encloses a first electrical wire and a second electrical wire together;

a first insertion path that is formed inside the shielding pipe and into which the first electrical wire is inserted;

a second insertion path that is formed inside the shielding pipe, is separated from the first insertion path by a partition wall, and into which the second electrical wire is inserted; and a shielding tube that includes at least a portion of a flexible shielding member that is tubular, and encloses an area of the first electrical wire, the area being led out of the first insertion path, wherein the shielding tube is connected to an end portion of the first insertion path so as to prevent the first electrical wire and the second electrical wire from being affected by electromagnetic noise therefrom.

The first insertion path and the shielding tube that serve as an insertion path for the first electrical wire are connected so as to prevent the first electrical wire and the second electrical wire from being affected by electromagnetic noise therefrom. Therefore, a shielding function can be secured.

DESCRIPTION OF EMBODIMENT

Figure 1:
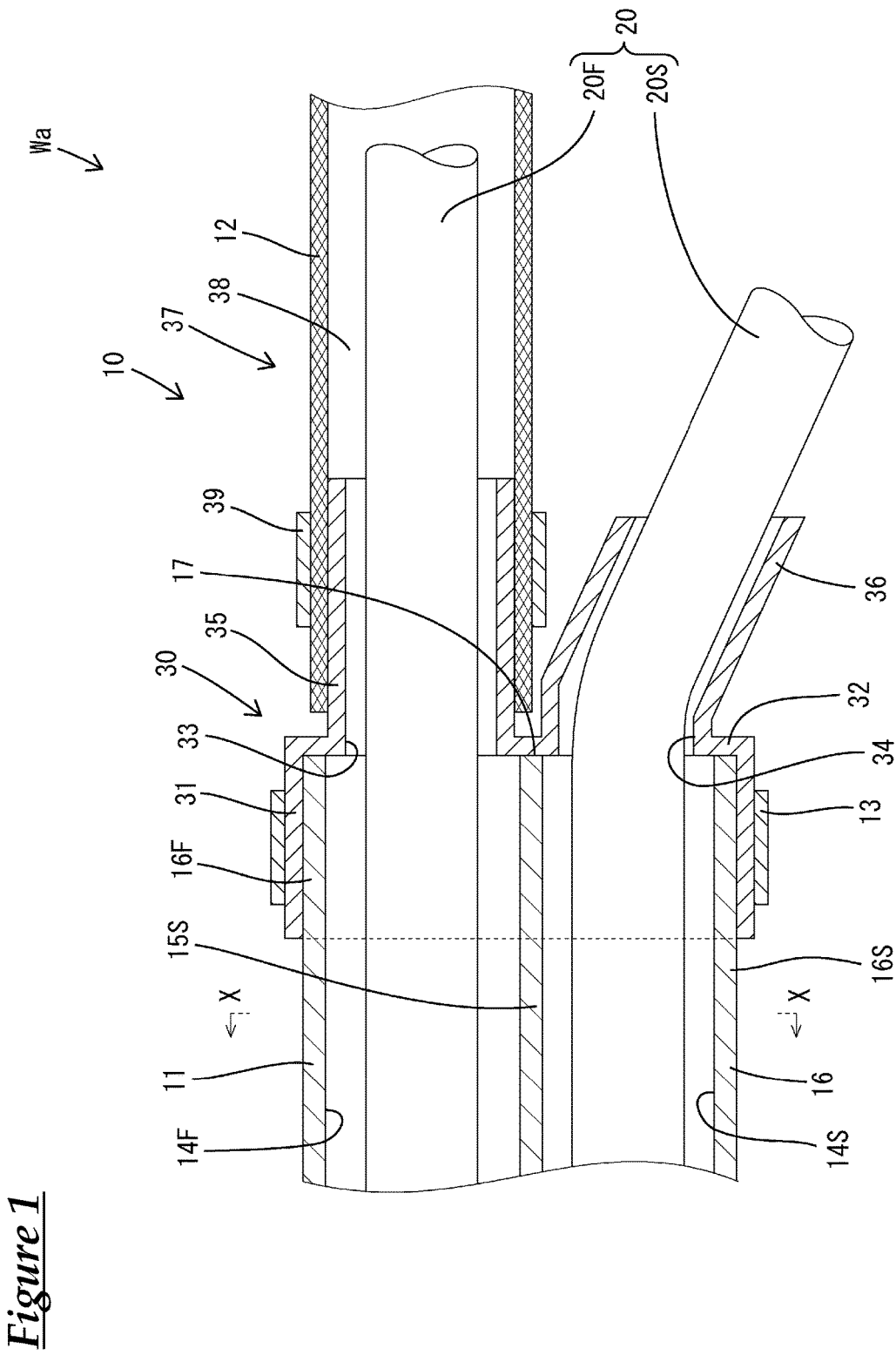
FIG. 1 is a cross-sectional view of a shielded conductive path according to a first embodiment.

The shielded conductive path according to the present design may include a connection member that includes a ring-shaped attachment portion that is attached to an outer circumferential surface of an edge portion of the shielding pipe, and a tubular connection portion that is connected to an edge surface of the shielding pipe so as to enclose an entire opening area of the first insertion path, and the shielding tube may be constituted by the tubular connection portion and the flexible shielding member that is connected to the tubular connection portion.

With this configuration, the shielding pipe and the flexible shielding member can be connected to each other as well as constitute the shielding tube, with the connection member being interposed therebetween.

In the shielded conductive path according to the present design, the connection member may include a branch tube portion that is connected to the second insertion path.

With this configuration, an area of the second electrical wire, the area being led out of the second insertion path, is inserted into the branch tube portion, and thus the area can be led out in a predetermined direction.

In the shielded conductive path according to the present design, the flexible shielding member may be attached to an outer circumferential surface of an edge portion of the shielding pipe, an area of the second electrical wire, the area being led out of the second insertion path, may be led out of the flexible shielding member via an outlet port of the flexible shielding member, a shielding wall that separates an area of the first electrical wire, the area being led out of the first insertion path, and an area of the second electrical wire, the area being led out of the second insertion path, from each other so as to prevent the areas from being affected by electromagnetic noise may be provided between an edge surface of the shielding pipe and the flexible shielding member, and the shielding tube may be constituted by the flexible shielding member and the shielding wall.

With this configuration, the second electrical wire is led to the outside via the outlet port that is provided in the flexible shielding member. Therefore, it is unnecessary to process the shielding pipe so that the shielding pipe allows the second electrical wire to be led out thereof.

In the shielded conductive path according to the present design, the flexible shielding member may be attached to an outer circumferential surface of an edge portion of the shielding pipe, the second electrical wire may be led out toward an outer circumferential surface of the shielding pipe via an outlet port of a circumferential wall portion that defines the second insertion path, a portion of the flexible shielding member may be connected to an edge surface of the shielding pipe so as to enclose an entire opening area of the first insertion path, and a tubular portion of the flexible shielding member, the portion being interconnected with the first insertion path, may serve as the shielding tube.

With this configuration, the second electrical wire is led to the outside via the outlet port that is formed in the shielding pipe. Therefore, it is unnecessary to, for example, process the flexible shielding member so that the flexible shielding member allows the second electrical wire to be led out thereof.

First Embodiment

Figure 2:
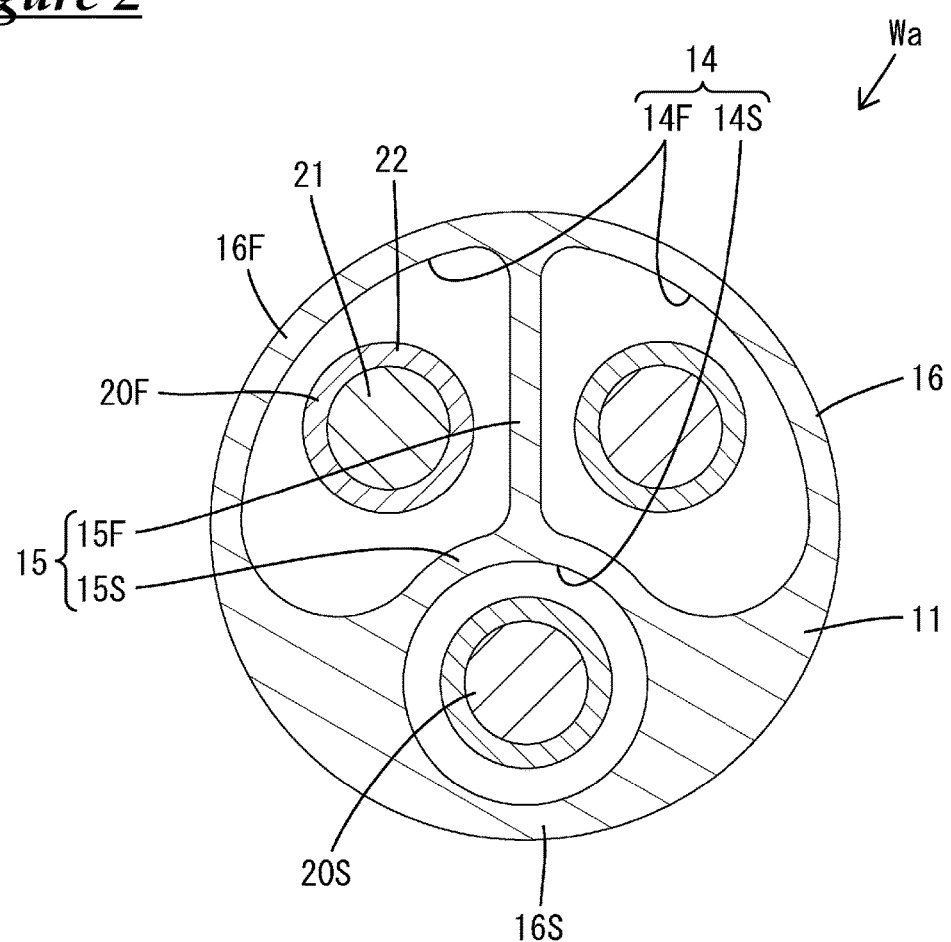
FIG. 2 is a cross-sectional view along a line X-X in FIG. 1.

The following describes an embodiment of the present design in detail with reference to FIGS. 1 to 2. A shielded conductive path Wa according to the first embodiment has a configuration in which a plurality of electrical wires 20 (three wires in the present embodiment) are enclosed and shielded by a shielding portion 10 that is tubular. The shielded conductive path Wa is routed under the floor of the vehicle body (not shown) of a vehicle such as a hybrid car, to connect devices that are installed in a rear part of the vehicle body, such as a high-voltage battery and a low-voltage battery (not shown), and devices that are installed in a front part of the vehicle body, such as an inverter and a fuse box (not shown), to each other.

Two electrical wires 20 out of the three electrical wires 20 are first electrical wires 20F that connect devices that are provided in the rear part of the vehicle, such as the high-voltage battery, and devices that are provided in the front part of the vehicle, such as the inverter, to each other. The remaining one electrical wire 20 is a second electrical wire 20S that connects devices that are provided in the rear part of the vehicle, such as the low-voltage battery, and devices that are provided in the front part of the vehicle, such as the fuse box, to each other. Out of the devices, at least the devices connected to the first electrical wires 20F are housed in a conductive shielded case.

The first electrical wires 20F and the second electrical wire 20S are both non-shielded electrical wires that have a circular cross section (see FIG. 2), in each of which an outer circumferential surface of a conductor 21 is enclosed by an insulating coating 22. The first electrical wires 20F are high-voltage electrical wires that constitute a high-voltage circuit, and are adapted to high voltages and large currents. Metal terminal parts (not shown) are connected to two end portions of each first electrical wire 20F, and are each electrically connected to a device. The second electrical wire 20S is a low-voltage electrical wire that constitutes a low-voltage circuit, and metal terminal parts (not shown) are connected to two end portions of the second electrical wire 20S, and are each electrically connected to a device.

The shielding portion 10 includes: a shielding pipe 11 that encloses the three electrical wires 20F and 20S together; a connection member 30 that is connected to either end portion of the shielding pipe 11 and encloses the three electrical wires 20F and 20S; and a flexible shielding member 12 that is tubular, is connected to the connection member 30, and only encloses the two first electrical wires 20F.

The shielding pipe 11 is made of a metal (such as steel, aluminum, copper, or stainless steel), and the external shape of the cross section thereof is a substantially perfect circle (see FIG. 2). The shielding pipe 11 is bent along a routing path of the electrical wires 20 in a three-dimensional direction. In the first embodiment, the shielding pipe 11 is generally routed in a front-rear direction of the vehicle under the floor of the vehicle, and both end portions of the shielding pipe 11 in the front-rear direction are bent upward and are guided to the inside of the vehicle. Note that the shielding pipe 11 is fixed to the body of the vehicle using a plurality of attachment parts that are made of resin (not shown).

The shielding pipe 11 includes a circumferential wall portion 16 that constitutes the outer circumferential surface of the shielding pipe 11. The circumferential wall portion 16 includes a first circumferential wall component 16F and a second circumferential wall component 16S. The shielding pipe 11 is provided with partition walls 15 that divide the internal space (the space that is enclosed by the circumferential wall portion 16) of the shielding pipe 11 into a plurality of electrical wire insertion paths 14 (three paths in the present embodiment). Two electrical wire insertion paths 14 out of the three electrical wire insertion paths 14 are first insertion paths 14F into which the first electrical wires 20F are inserted. These two first insertion paths 14F are partitioned by a first partition wall 15F. The remaining one electrical wire insertion path 14 is a second insertion path 14S into which the second electrical wire 20S is inserted. The first insertion paths 14F and the second insertion path 14S are partitioned by a second partition wall 15S. That is to say, the first insertion paths 14F are surrounded by the first circumferential wall component 16F, the first partition wall 15F, and the second partition wall 15S. The second insertion path 14S is surrounded by the second circumferential wall component 16S and the second partition wall 15S.

The connection member 30 is made of a metal (such as steel, aluminum, copper, stainless steel), and has a mode that is formed by integrating a ring-shaped attachment portion 31, a support wall portion 32, a tubular connection portion 35, and a branch tube portion 36 into one piece. The ring-shaped attachment portion 31 has the shape of a ring that is in intimate contact with the outer circumferential surface of an edge portion of the shielding pipe 11. The ring-shaped attachment portion 31 is fixed to the outer circumferential surface of the shielding pipe 11, using a fastening ring 13 that encloses the outer circumferential surface of the ring-shaped attachment portion 31, such that the ring-shaped attachment portion 31 is conductive with the outer circumferential surface of the shielding pipe 11 and is restricted from becoming separated.

The support wall portion 32 is continuous with one end edge of the ring-shaped attachment portion 31 at a substantially right angle, and is in contact with the entire area of an edge surface 17 of the shielding pipe 11 except the area of the first partition wall 15F, without a gap therebetween. The support wall portion 32 is provided with one first communicating hole 33 that corresponds to the two first insertion paths 14F, and a second communicating hole 34 that corresponds to the second insertion path 14S. The first communicating hole 33 encloses opening areas of the two first insertion paths 14F together, and does not correspond to an opening area of the second insertion path 14S.

The tubular connection portion 35 protrudes from an opening edge of the first communicating hole 33 to the side that is opposite the shielding pipe 11 so as to have a cantilever shape. That is to say, a base end portion of the tubular connection portion 35 is continuous with the ring-shaped attachment portion 31, with the support wall portion 32 being interposed therebetween. A base end portion of the flexible shielding member 12 is fixed to the outer circumferential surface of the tubular connection portion 35, using a fastening ring 39, such that the base end portion is conductive with the outer circumferential surface of the tubular connection portion 35 and no gap is formed therebetween. The flexible shielding member 12 is a braided member that is formed by interweaving conductive thin metal lines (e.g. copper) into a meshed pattern so as to be tubular. Note that the flexible shielding member 12 may be formed by winding a metal foil so as to be tubular, instead of being a braided member.

The tubular connection portion 35 and the flexible shielding member 12 constitute a shielding tube 37. One extension insertion path 38 that is interconnected with the two first insertion paths 14F is provided inside the shielding tube 37. Areas of the two first electrical wires 20F, the areas being led out of the shielding pipe 11 from the first insertion paths 14F, are inserted into the extension insertion path 38 (the shielding tube 37). No large clearance or opening that allows electromagnetic noise from the first electrical wires 20F to pass therethrough is provided in the portion where the first insertion paths 14F and the extension insertion path 38 are connected. Also, no large clearance or opening that allows electromagnetic noise from the first electrical wires 20F to pass therethrough to the outside is provided in the circumferential surface of the shielding tube 37 or the circumferential surfaces of the first insertion paths 14F, which serve as insertion paths for the first electrical wires 20F.

The second communicating hole 34 corresponds to the opening area of the second insertion path 14S, and does not correspond to the opening areas of the first insertion paths 14F. Also, the branch tube portion 36 protrudes from an opening edge of the second communicating hole 34 to the side that is opposite the shielding pipe 11 so as to have a cantilever shape. An area of the second electrical wire 20S, the area being led out of the shielding pipe 11 from the second insertion path 14S, penetrates the branch tube portion 36.

As described above, the shielded conductive path Wa according to the first embodiment includes the shielding pipe 11 that encloses the first electrical wire 20F and the second electrical wire 20S together; and the shielding tube 37 that encloses areas of the first electrical wires 20F, the areas being led out of the first insertion paths 14F. The first insertion paths 14F into which the first electrical wires 20F are inserted and the second insertion path 14S that is partitioned by the partition wall 15 (the second partition wall 15S) so as to be separated from the first insertion paths 14F and into which the second electrical wire 20S is inserted are formed inside the shielding pipe 11. Also, the shielding tube 37 includes the flexible shielding member 12 that is tubular.

This shielding tube 37 is connected to an end portion of the first insertion paths 14F so as to prevent the first electrical wires 20F and the second electrical wire 20S from being affected by electromagnetic noise therefrom. With this configuration, the first insertion paths 14F and the shielding tube 37, which serve as insertion paths for the first electrical wires 20F, are connected to each other so as to prevent the first electrical wires 20F and the second electrical wire 20S from being affected by electromagnetic noise therefrom. Therefore, this configuration is reliable in terms of its shielding function.

The shielded conductive path Wa according to the first embodiment includes the connection member 30 that is made of metal. The connection member 30 includes: the ring-shaped attachment portion 31 that is attached to the outer circumferential surface of an edge portion of the shielding pipe 11; and the tubular connection portion 35 that is connected to the edge surface 17 of the shielding pipe 11 without a gap therebetween so as to cover the entire area of the second partition wall 15S and the entire area of the first circumferential wall portion 16F within the edge surface 17. This tubular connection portion 35 encloses opening areas of the two first insertion paths 14F within the edge surface 17 of the shielding pipe 11 together so as to cover the entire circumference. The shielding tube 37 is constituted by the tubular connection portion 35 and the flexible shielding member 12 that is connected to the tubular connection portion 35. With this configuration, the shielding pipe 11 and the flexible shielding member 12 can be connected to each other as well as constitute the shielding tube 37, with the connection member 30 being interposed therebetween.

Furthermore, the connection member 30 includes the branch tube portion 36 that is connected to the second insertion path 14S. With this configuration, an area of the second electrical wire 20S, the area being led out of the second insertion path 14S, is inserted into the branch tube portion 36, and thus the area can be led out in a predetermined direction.

Second Embodiment

Figure 3:
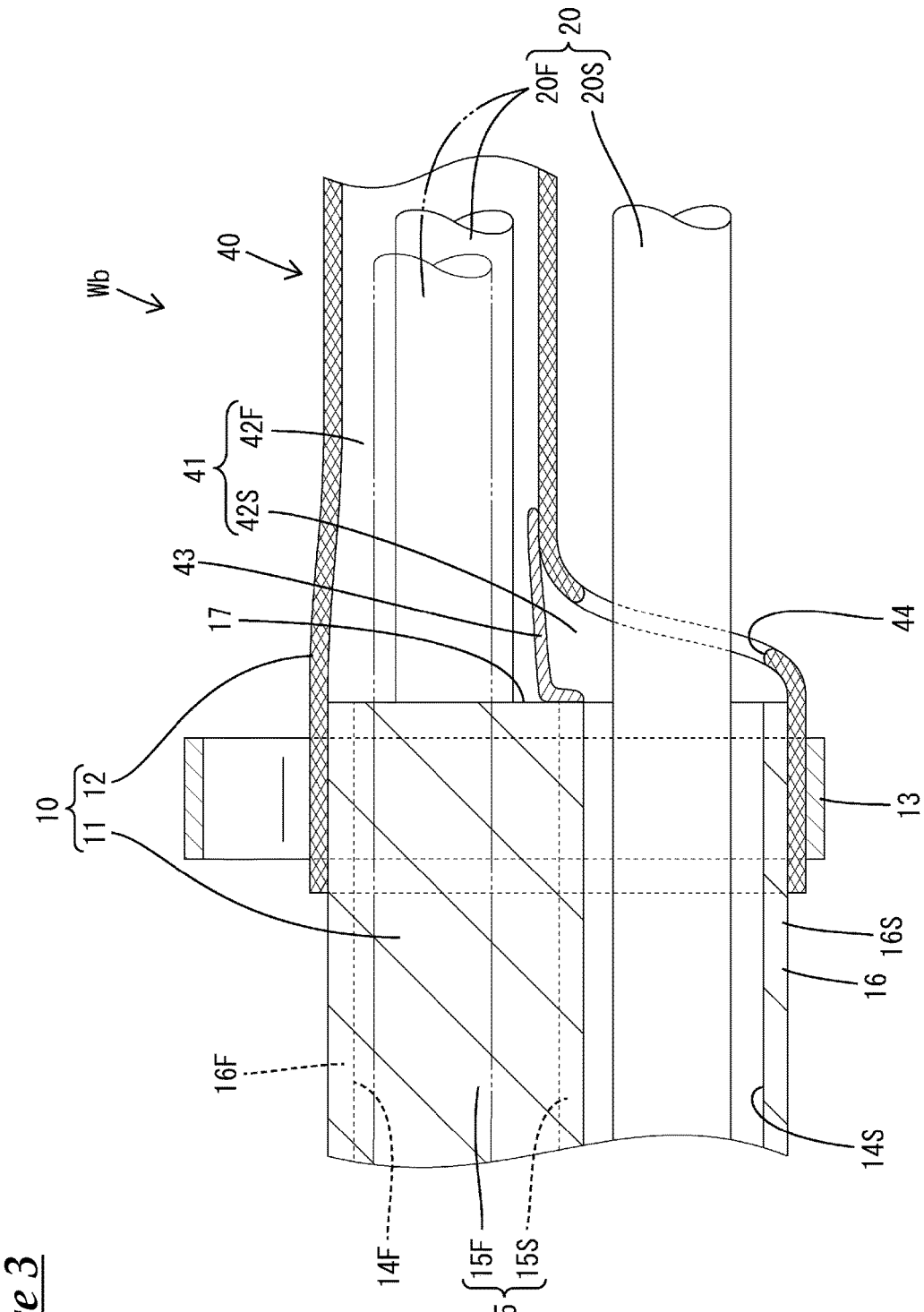
FIG. 3 is a cross-sectional view of a shielded conductive path according to a second embodiment.

Next, a second embodiment of the present invention will be described with reference to FIG. 3. A shielded conductive path Wb according to the second embodiment includes a shielding tube 40, which is different from the above-described first embodiment. Other components are the same as those in the above-described first embodiment. Therefore the same components are given the same reference signs, and descriptions of the configurations, actions, and effects of the components are omitted.

The shielding portion 10 includes the shielding pipe 11 that is made of metal, and into which the three electrical wires 20F and 20S are inserted such that they are enclosed together by the shielding pipe 11; and the flexible shielding member 12 that is tubular and is connected to either end portion of the shielding pipe 11 so as to enclose portions of the three electrical wires 20F and 20S together, the portions being led out of the shielding pipe 11. As in the first embodiment, the first insertion paths 14F into which the first electrical wires 20F are inserted and the second insertion path 14S into which the second electrical wire 20S is inserted are formed inside the shielding pipe 11.

As in the first embodiment, the flexible shielding member 12 is a braided member. One end side of the flexible shielding member 12 is swaged and fixed to the outer circumferential surface of the shielding pipe 11 so as to be conductive, using the fastening ring 13. The space that is enclosed by the flexible shielding member 12 is an outside-the-pipe shielding space 41 that is adjacent to the edge surface 17 of the shielding pipe 11 and is interconnected with the first insertion paths 14F and the second insertion path 14S. The outside-the-pipe shielding space 41 is partitioned by a shielding wall 43 that is made of metal, into one first shielding space 42F that is only interconnected with the two first insertion paths 14F, and a second shielding space 42S that is only interconnected with the second insertion path 14S.

The shielding wall 43 is, as with the flexible shielding member 12, constituted by a braided member that is formed by interweaving metal wires, a metal foil, or the like. One edge portion of the shielding wall 43 is connected to the edge surface 17 of the shielding pipe 11 so as to cover the entire area of the second partition wall 15S within the edge surface 17, the second partition wall 15S separating the two first insertion paths 14F and the second insertion path 14S from each other, and the other edge portion of the shielding wall 43 is connected to the flexible shielding member 12. The shielding wall 43 can be connected through welding or by using an adhesive, for example.

The shielding wall 43 and an area of the flexible shielding member 12, the area defining the first shielding space 42F, function as the shielding tube 40 into which the two first electrical wires 20F are inserted. Areas of the first electrical wires 20F, the areas being led out of the first insertion paths 14F, are inserted into the shielding tube 40 (the first shielding space 42F). An area of the second electrical wire 20S, the area being led out of the second insertion path 14S, penetrates the second shielding space 42S, penetrates an outlet port 44 of the flexible shielding member 12, and is led out of the flexible shielding member 12 (the shielding portion 10).

A base end portion of the shielding tube 40 is connected to the shielding pipe 11 so as to enclose opening areas of the two first insertion paths 14F together. No large clearance or opening that allows electromagnetic noise to pass therethrough is provided in the portion where the shielding pipe 11 and the shielding tube 40 are connected. Therefore, there is no risk of the second electrical wire 20S being affected by electromagnetic noise from the first electrical wires 20F that are inserted into the first insertion paths 14F and the shielding tube 40 (the first shielding space 42F).

In the shielded conductive path Wb according to the second embodiment: the flexible shielding member 12 is attached to the outer circumferential surface of an edge portion of the shielding pipe 11; an area of the second electrical wire 20S, the area being led out of the second insertion path 14S, is led out of the flexible shielding member 12 via the outlet port 44 of the flexible shielding member 12; and the shielding wall 43 is provided between the edge surface 17 of the shielding pipe 11 and the flexible shielding member 12 such that the first electrical wires 20F, the areas being led out of the first insertion paths 14F, and an area of the second electrical wire 20S, the area being led out of the second insertion path 14S, are separated from each other so as to be prevented from being affected by electromagnetic noise. The flexible shielding member 12 and the shielding wall 43 constitute the shielding tube 40. With this configuration, the second electrical wire 20S is led to the outside via the outlet port 44 that is provided in the flexible shielding member 12. Therefore, it is unnecessary to process the shielding pipe 11 so that the shielding pipe 11 allows the second electrical wire 20S to be led out thereof.

Third Embodiment

Figure 4:
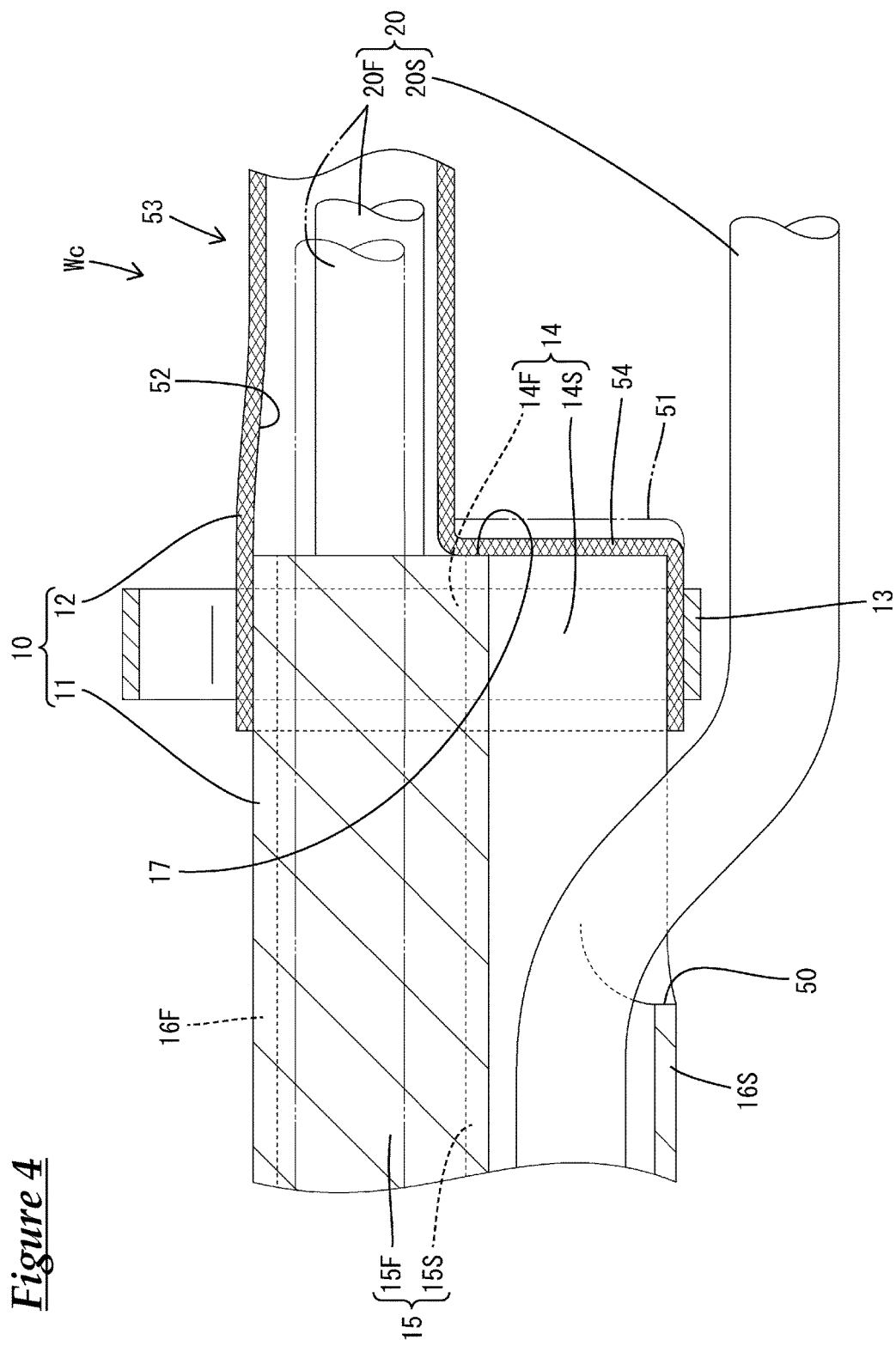
FIG. 4 is a cross-sectional view of a shielded conductive path according to a third embodiment.

Next, a shielded conductive path Wc according to a third embodiment of the present design will be described with reference to FIG. 4. Note that components that are the same as those in the first embodiment are given the same reference signs, and duplicate descriptions are omitted.

The shielded conductive path Wc according to the third embodiment includes, as with the first and second embodiments, the shielding pipe 11 that encloses the two first electrical wires 20F and the one second electrical wire 20S together, and the flexible shielding member 12 that is tubular and is connected to an end portion of the shielding pipe 11. Also, as in the first and second embodiments, the inside of the shielding pipe 11 is divided by the partition walls 15 (the first partition wall 15F and the second partition wall 15S) into the three electrical wire insertion paths 14F and 14S. The first electrical wires 20F are inserted into the first insertion paths 14F, and the second electrical wire 20S is inserted into the second insertion path 14S.

In the shielded conductive path Wb according to the above-described second embodiment, the second electrical wire 20S penetrates the outlet port 44 of the flexible shielding member 12 and is led out of the shielding portion 10, whereas, in the shielded conductive path Wc according to the third embodiment, an outlet port 50 is formed in the second circumferential wall component 16S of the circumferential wall portion 16 of the shielding pipe 11, the second circumferential wall component 16S defining the second insertion path 14S, and the second electrical wire 20S that is inserted into the second insertion path 14S is led out of the shielding portion 10 via this outlet port 50.

Also, as in the second embodiment, the flexible shielding member 12 is fixed to the outer circumferential surface of an edge portion of the shielding pipe 11. A portion of the flexible shielding member 12 is bent and is connected to the edge surface 17 of the shielding pipe 11 so as to close the entire opening area of the second insertion path 14S. Specifically, the flexible shielding member 12 is connected to the edge surface 17 of the shielding pipe 11 so as to cover the entire area of the second partition wall 15S that separates the first insertion paths 14F and the second insertion path 14S from each other, and the entire area of the second circumferential wall component 16S that defines the second insertion path 14S, within the edge surface 17. The portion where this flexible shielding member 12 and the shielding pipe 11 are connected is fixed using a solder material 51 so as not to become separated.

As described above, the flexible shielding member 12 is connected to the shielding pipe 11, and thus an extension insertion path 52 that is interconnected with the first insertion paths 14F and is not interconnected with the second insertion path 14S is formed inside the flexible shielding member 12. A tubular area of the flexible shielding member 12, the area defining the extension insertion path 52, functions as a shielding tube 53. The shielding tube 53 encloses areas of the first electrical wires 20F, the areas being led out of the first insertion paths 14F.

Also, an area of the flexible shielding member 12, the area closing the entire opening portion of the second insertion path 14S, functions as a shielding wall 54. No large clearance or opening that allows electromagnetic noise to pass therethrough is provided between an opening edge of the second insertion path 14S within the edge surface 17 of the shielding pipe 11 and the shielding wall 54. Therefore, there is no risk of the second electrical wire 20S being affected by electromagnetic noise from the first electrical wires 20F that are inserted into the first insertion paths 14F and the extension insertion path 52.

In the shielded conductive path We according to the third embodiment, the flexible shielding member 12 is attached to the outer circumferential surface of an edge portion of the shielding pipe 11, and the second electrical wire 20S is led out of the shielding pipe 11 toward the outer circumferential surface thereof via the outlet port 50 of the second circumferential wall component 16S that defines the second insertion path 14S. Also, a portion of the flexible shielding member 12 is connected to the edge surface 17 of the shielding pipe 11 so as to enclose the entire opening areas of the first insertion paths 14F. In addition, a tubular portion of the flexible shielding member 12, the portion being interconnected with the first insertion paths 14F, serves as the shielding tube 53. With this configuration, the second electrical wire 20S is led to the outside via the outlet port 50 that is formed in the shielding pipe 11, and therefore it is unnecessary to, for example, process the flexible shielding member 12 so that the flexible shielding member 12 allows the second electrical wire 20S to be led out thereof.

Other Embodiments

The present invention is not limited to the embodiments that have been described above with reference to the drawings, and, for example, the following embodiments are also included in the technical scope of the present invention.

In the above-described first to third embodiments, a description has been given of an example in which the plurality of electrical wires include an electrical wire for high voltages and an electrical wire for low voltages. However, the plurality of electrical wires may be a combination of a power supply line and a signal line.

In the above-described first to third embodiments, the shielding pipe is only made of a metal material. However, the shielding pipe may be made of any material and may be configured in any manner as long as it has a shielding function. For example, the shielding pipe may have a structure in which a metal foil is coaxially embedded in a pipe that is made of resin.

In the above-described first to third embodiments, the flexible shielding member is a braided member that is formed so as to be tubular by interweaving conductive thin metal lines (e.g. copper) into a meshed pattern. However, the flexible shielding member may be, for example, a corrugated tube into which a metal foil is inserted so as to extend along the entire circumference and the entire length of the corrugated tube.

In the above-described first to third embodiments, the inside of the shielding pipe is divided into three insertion paths. However, the number of insertion paths that are to be provided in the shielding pipe can be changed as appropriate according to the type of electrical wires that are desired to be routed so as to be separate from each other.

In the above-described first to third embodiments, the second electrical wire, out of electrical wires of two types, is led out of the shielding portion. However, for example, electrical wires of three or more types may be enclosed by the shielding portion, and of these, electrical wires of two or more types may be led out of the shielding portion from outlet ports that are provided so as to respectively correspond to the electrical wires of two or more types.

In the above-described first to third embodiments, the external shape of the cross section of the shielding pipe is a substantially perfect circle. However, this is not essential, and the external shape may be ellipsoidal, for example.

In the above-described first to third embodiments, one electrical wire is inserted into one insertion path. However, a plurality of electrical wires may be inserted into one insertion path.

In the above-described first embodiment, it is possible that the branch tube portion is not formed in the connection member.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

REFERENCE SIGNS LIST

Wa, Wb, Wc: Shielded Conductive Path
11: Shielding Pipe
14F: First Insertion Path
14S: Second Insertion Path
15: Partition Walls
16: Circumferential Wall Portion
17: Edge Surface of Shielding Pipe
20F: First Electrical Wire
20S: Second Electrical Wire
30: Connection Member
31: Ring-shaped Attachment Portion
35: Tubular Connection Portion
36: Branch Tube Portion
37, 40, 53: Shielding Tube
43: Shielding Wall
44, 50: Outlet Port

The invention claimed is:

1. A shielded conductive path comprising:
a shielding pipe that encloses a first electrical wire and a second electrical wire together;
a first insertion path that is formed inside the shielding pipe and into which the first electrical wire is inserted;
a second insertion path that is formed inside the shielding pipe, is separated from the first insertion path by a partition wall that is part of the shielding pipe, and into which the second electrical wire is inserted; and
a shielding tube that includes at least a portion of a connection member and at least a portion of a flexible shielding member that is tubular, the connection member includes a ring-shaped attachment portion attached to an outer circumferential surface of an edge portion of the shielding pipe and a tubular connection portion, and the flexible shielding member is attached to an outer circumferential surface of tubular connection portion and encloses an area of the first electrical wire, the area being led out of the first insertion path;

wherein the shielding tube is connected to an end portion of the first insertion path so as to prevent the first electrical wire and the second electrical wire from being affected by electromagnetic noise therefrom.

2. The shielded conductive path according to claim 1, wherein the tubular connection portion is connected to an edge surface of the shielding pipe so as to enclose an entire opening area of the first insertion path;

wherein the shielding tube is constituted by the tubular connection portion and the flexible shielding member that is connected to the tubular connection portion.

3. The shielded conductive path according to claim 2, wherein the connection member includes a branch tube portion that is connected to the second insertion path.

* * * * *